United States Patent
Moulding et al.

(10) Patent No.: US 6,915,493 B2
(45) Date of Patent: Jul. 5, 2005

(54) METHOD AND APPARATUS FOR PROVIDING FEEDBACK FROM A COMPACTOR TO A ROUTER TO FACILITATE LAYOUT OF AN INTEGRATED CIRCUIT

(75) Inventors: Edward G. Moulding, Nepean (CA); Vadim Gouterman, Toronto (CA)

(73) Assignee: Synopsys, Inc., Mountain View, CA (US)

( * ) Notice: Subject to any disclaimer, the term of this patent is extended or adjusted under 35 U.S.C. 154(b) by 295 days.

(21) Appl. No.: 10/329,010

(22) Filed: Dec. 23, 2002

(65) Prior Publication Data

US 2004/0123252 A1 Jun. 24, 2004

(51) Int. Cl.[7] .............................................. G06F 17/50
(52) U.S. Cl. ................. 716/2; 716/11; 716/12
(58) Field of Search ................. 716/2, 10–14, 716/18

(56) References Cited

U.S. PATENT DOCUMENTS 5,984,510 A * 11/1999 Guruswamy et al. .......... 716/2

* cited by examiner

Primary Examiner—Matthew Smith
Assistant Examiner—Paul Dinh
(74) Attorney, Agent, or Firm—Park, Vaughan & Fleming, LLP; Edward S. Grundler

(57) ABSTRACT

One embodiment of the invention provides a system that communicates feedback from a compactor to a router to facilitate layout of an integrated circuit. The system operates by first receiving a routing for a cell in an integrated circuit layout at the compactor. The system then attempts to compact the routing. If compaction of the routing fails, the system identifies an infeasibility path in the routing and rips up traces on the infeasibility path while leaving other traces undisturbed. The system then adjusts parameters associated with the routing process and reroutes the cell using the adjusted parameters. The system then attempts to compact this rerouting.

16 Claims, 4 Drawing Sheets

METHOD AND APPARATUS FOR PROVIDING FEEDBACK FROM A COMPACTOR TO A ROUTER TO FACILITATE LAYOUT OF AN INTEGRATED CIRCUIT

BACKGROUND

1. Field of the Invention

The invention relates to the process of fabricating integrated circuits. More specifically, the invention relates to a method and an apparatus for providing feedback from a compactor to a router to facilitate layout of an integrated circuit.

2. Related Art

Recent advances in integrated circuit technology have largely been accomplished by decreasing the feature size of circuit elements on a semiconductor chip. As the feature size of these circuit elements continues to decrease, circuit designers are forced to deal with problems that arise in placing ever larger numbers of circuit elements on a semiconductor die.

The process of fabricating an integrated circuit starts with a circuit design. The elements of this circuit design are first placed to form an initial layout of the integrated circuit. Next, a router adds traces to the layout to connect these elements together. After the router has finished, the layout is compacted to produce a final layout.

Note that in some systems, the router relaxes strict design rule check (DRC) correctness to enable a routing to be generated successfully. In these systems, the compactor is subsequently responsible for enforcing strict DRC correctness. This approach typically works well. However, in many cases a routing is generated successfully but contains infeasibilities, which cannot be resolved by the compactor.

When the compactor encounters an infeasibility, a new placement is typically routed and compacted in an attempt to overcome the infeasibilities. This process is repeated as many times as is necessary to produce an acceptable layout. Because of the large number of circuit elements that can be incorporated into a modern integrated circuit, this process can be extremely time consuming.

Hence, what is needed is a method and an apparatus for generating a layout for an integrated circuit without the problems described above.

SUMMARY

One embodiment of the invention provides a system that communicates feedback from a compactor to a router to facilitate layout of an integrated circuit. The system operates by first receiving a routing for a cell in an integrated circuit layout at the compactor. The system then attempts to compact the routing. If compaction of the routing fails, the system identifies an infeasibility path in the routing and rips up traces on the infeasibility path while leaving other traces undisturbed. The system then adjusts parameters associated with the routing process and reroutes the cell using the adjusted parameters. The system then attempts to compact this rerouting.

In a variation of this embodiment, adjusting the parameters associated with the routing process involves adjusting design rule check (DRC) correctness parameters to enforce strict DRC correctness in the y-direction and to relax DRC correctness in the x-direction.

In a further variation, adjusting the parameters associated with the routing process involves penalizing placement of movable objects in proximity to the infeasibility path.

In a further variation, the system rips up additional traces in the cell, whereby ripping up additional traces increases possibilities for rerouting the infeasibility path, thereby providing more freedom for changes in the routing.

In a further variation, if recompaction of the routing fails, the system repeats the steps of identifying the infeasibility path in the routing, ripping up traces routed on the infeasibility path while leaving other traces undisturbed, adjusting parameters associated with the routing process, rerouting the cell using the adjusted design rule check correctness parameter, and attempting to compact this rerouting.

DETAILED DESCRIPTION

Feedback to Router

Figure 1:
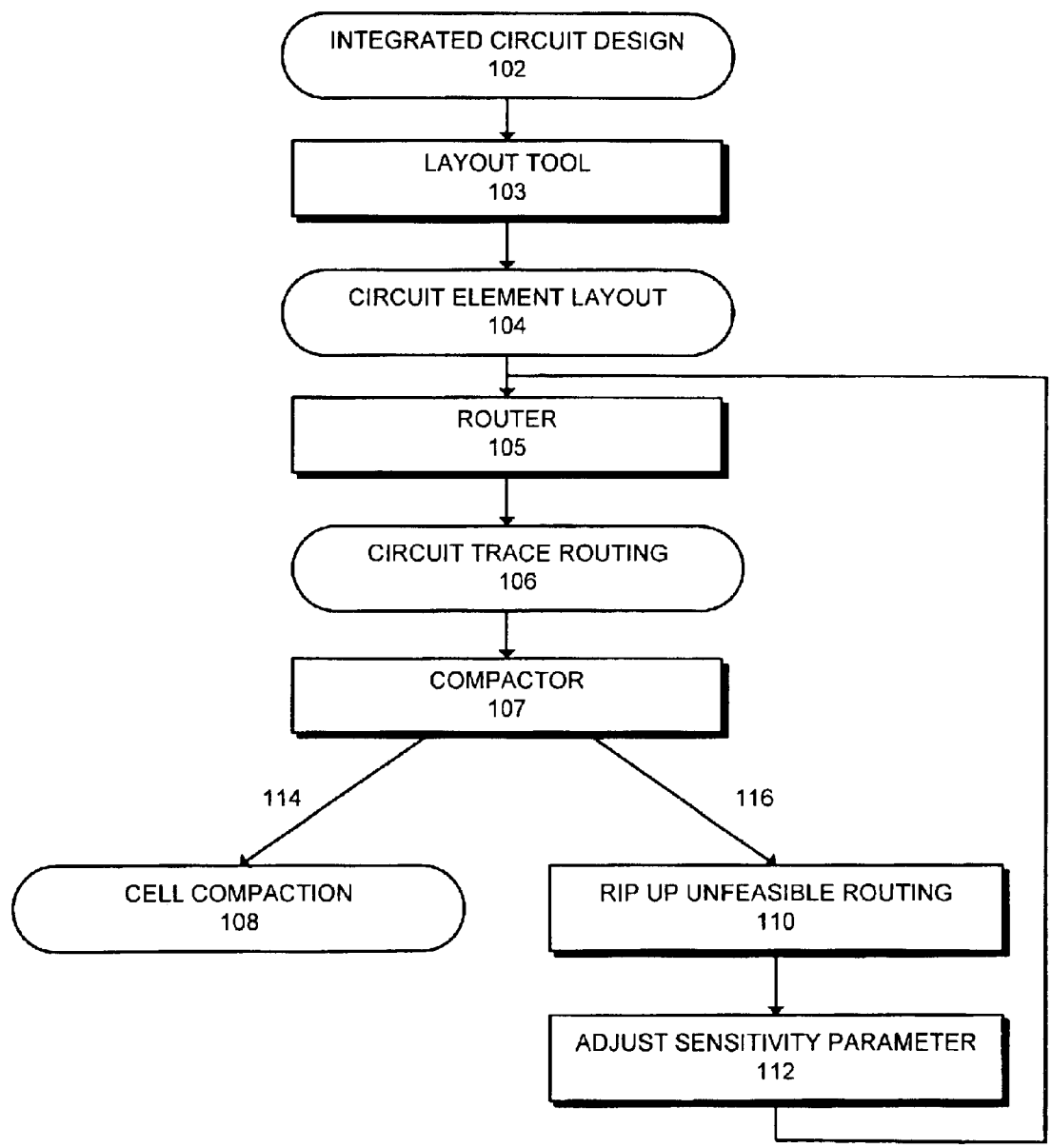
FIG. 1 illustrates the process of laying out an integrated circuit in accordance with an embodiment of the invention.

FIG. 1 illustrates the process of generating a layout for an integrated circuit in accordance with an embodiment of the invention. The system starts by receiving an integrated circuit design 102. Next, layout tool 103 places the elements of the design into a circuit element layout 104. A router 105 then adds traces to connect the circuit elements yielding circuit trace routing 106.

Compactor 107 then attempts to compact the layout. If circuit trace routing 106 includes only feasible routings 114, a compactor compacts the routing yielding cell compaction 108. If circuit trace routing 106 includes an infeasible routing 116, the system rips up the infeasible routing at 110, adjusts routing parameters as described below at 112, and causes the router 105 to generate a new circuit trace routing 106, which is hopefully feasible.

The re-routing process starts by ripping up traces along the infeasibility path. Additionally, three further techniques can be applied to guide the re-routing process towards feasibility. These techniques are as follows:

1. Enforcing strict DRC correctness in the y-direction during the reroute. DRC correctness in the x-direction can be relaxed in conjunction with enforcing strict DRC correctness in the y-direction to ensure that the router gives priority to the y-direction.
2. Ripping up extra traces, in addition to those directly involved in the infeasibility path, in order to give more freedom for changes in the routing. When choosing the extra traces to rip up, the aim is to maximize the possibilities for good re-routing while not ripping up too many traces.
3. Penalizing the placement of "movable objects" (contacts, ports, and diodes) in the region of the infeasibility path.

Note that combinations of the above techniques can be used.

Ripping up traces is done by extracting the shapes from the infeasibility path and identifying which traces contain edges, which correspond to these shapes. In the case of infeasibilities containing snapping constraints, any traces containing shapes which vertically overlap the shape involved in the snapping constraint are also ripped up. This makes up for the shortage of constraints currently given by the infeasibility path in snapping cases.

Enforcing Strict DRC Correctness

Figure 2A:
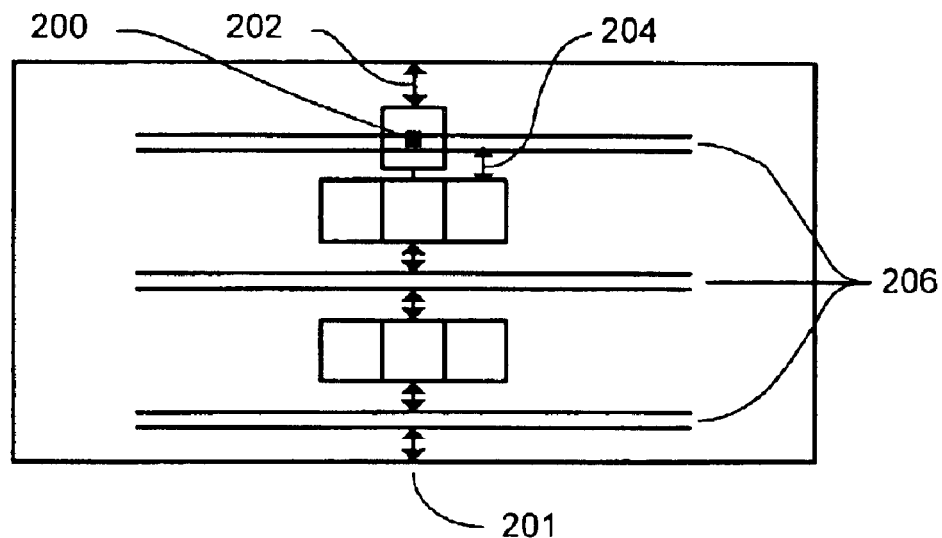
FIG. 2A illustrates an infeasible routing in accordance with an embodiment of the invention.

FIG. 2A illustrates an exemplary infeasible routing in accordance with an embodiment of the invention. As illustrated in FIG. 2A, trace 206 is routed so that it connects with element 200. Element 200 is positioned so that its spacing 202 from the edge of the cell is acceptable. However, the spacing 204 of trace 206 from other features in the cell is too small, therefore the routing is infeasible along infeasibility path 201.

The systems starts by ripping up traces along infeasibility path 201, which involves ripping up traces 206 and element 200. Next, the DRC correctness parameter is adjusted and the layout is returned to the router for another attempt at routing. For example, during the initial routing, assume the DRC correctness values for the x and y directions are (0.8, 0.8). These values can be adjusted to (0.6, 1.0).

Figure 2B:
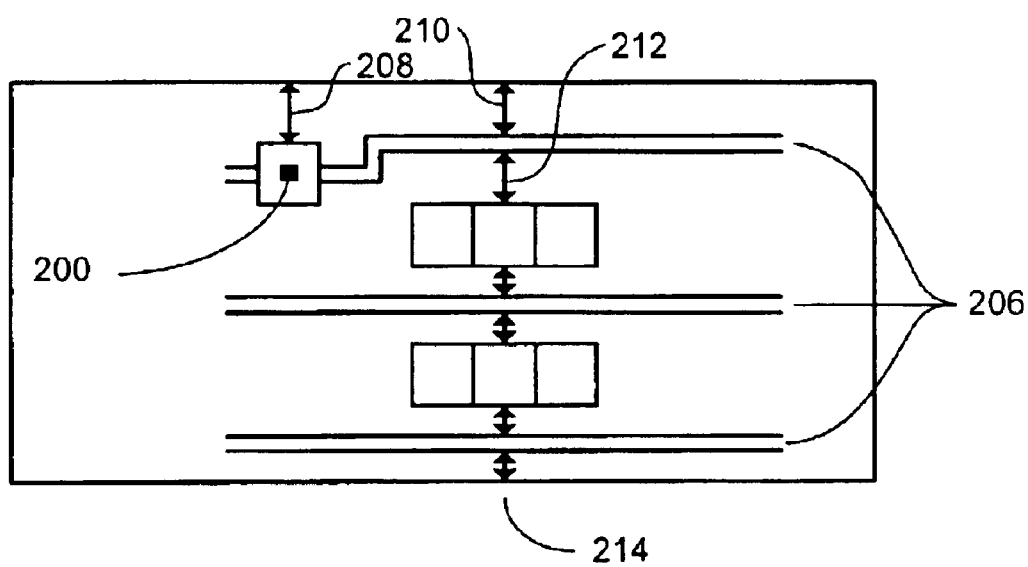
FIG. 2B illustrates a feasible routing in accordance with an embodiment of the invention.

FIG. 2B illustrates a feasible routing in accordance with an embodiment of the invention. As illustrated in FIG. 2B, element 200 has been moved while still providing acceptable spacing 208 of element 200 from the edge of the cell. Circuit trace 206 has also been rerouted so that spacing 210 from the edge of the cell and spacing 212 from other features within the cell are acceptable, thereby providing a feasible path at 214. The compactor is now able to compact the cell.

In conjunction with ripping up traces on the infeasible path, traces in the vicinity of the infeasible path can also be ripped up. This allows greater leeway in re-routing the cell. Note that the number of additional traces that can be ripped up may be limited by the ability of the router.

Penalizing Placement of Movable Objects

Figure 3A:
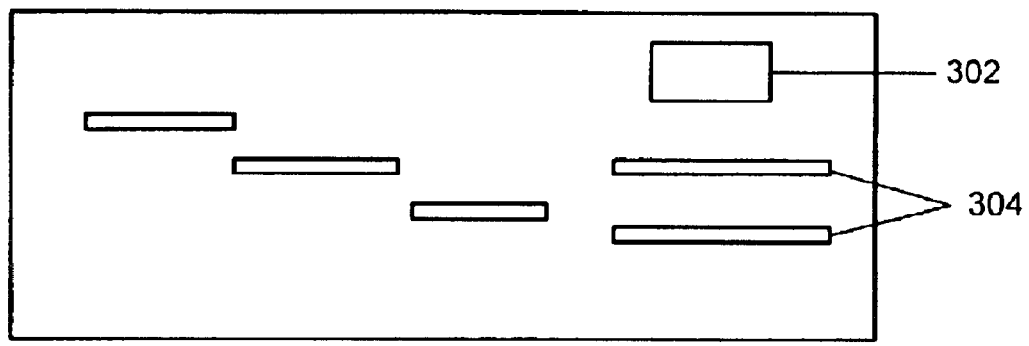
FIG. 3A illustrates a circuit element in the path of a trace in accordance with an embodiment of the invention.

FIG. 3A illustrates a movable object 302 in the same vertical path as other traces 304, thereby causing an infeasible routing. In this case, both movable object 302 and traces 304 are ripped up and the layout returned to the router for another attempt at routing with a penalty assigned for placing movable object 302 in this vertical region.

Figure 3B:
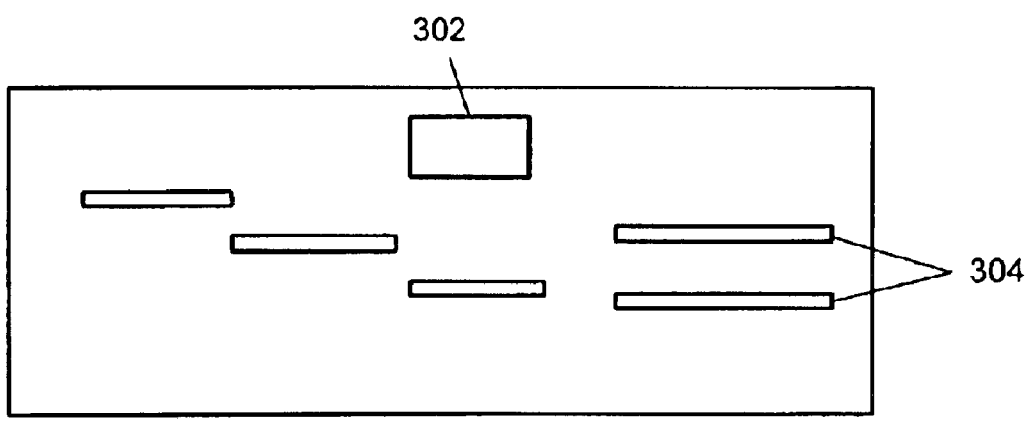
FIG. 3B illustrates moving a circuit element to allow compaction in accordance with an embodiment of the invention.

FIG. 3B illustrates how movable object 302 from FIG. 3A can be relocated to the side to allow feasible compaction in accordance with an embodiment of the invention.

Providing Feedback

Figure 4:
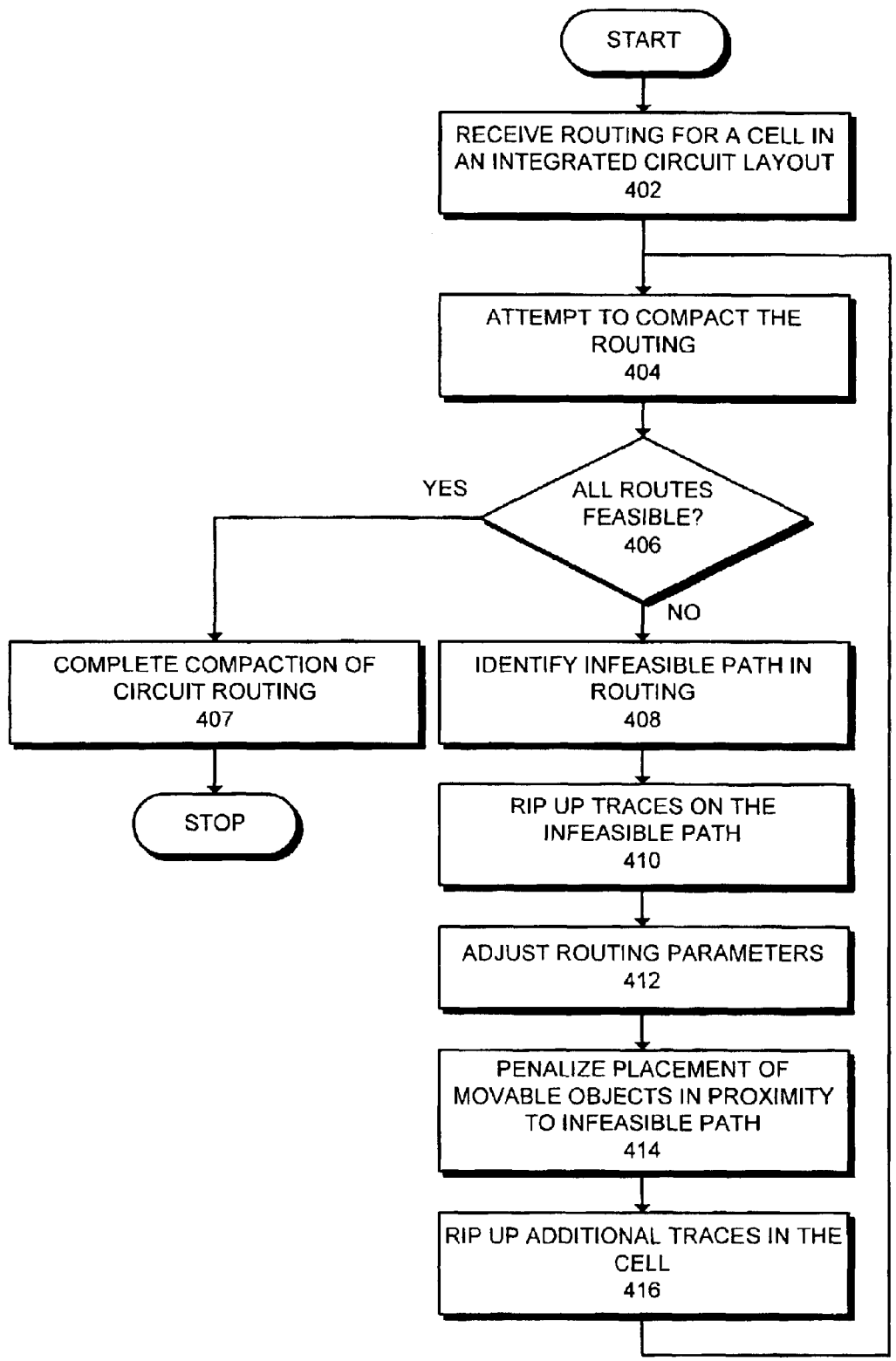
FIG. 4 is a flowchart illustrating the process of providing feedback from a compactor to a router in accordance with an embodiment of the invention.

FIG. 4 is a flowchart illustrating the process of providing feedback from a compactor to a router in accordance with an embodiment of the invention. The system starts when a routing for a cell in an integrated circuit layout is received (step 402). Next, the system attempts to compact the routing (step 404). The system then determines if all paths are feasible (step 406). If so, the system completes the compaction process (step 407).

If all paths are not feasible at step 406, the system identifies the infeasibility path or paths in the routing (step 408). Next, the system rips up traces on the infeasibility path (step 410). The system then adjusts the design rule check parameter to provide a tighter tolerance in the y-direction and a relaxed tolerance in the x-direction (step 412).

Next, the system adds a penalty for placement of moveable objects in the proximity of the infeasibility path (step 414). The system also rips up additional traces in the cell that are horizontally close to the infeasibility path region to allow greater leeway during rerouting (step 416). The process then returns to step 404 to attempt another routing.

In one embodiment of the invention, the process for identifying these additional traces in the cell is as described as follows. Let T0 represent all of the traces from the original fully routed cell and let T1 represent the infeasibility path traces. A set of potential extra traces for ripup (T2) is then identified by adding traces in increasing order of how horizontally close they are to the infeasibility path region, and continuing to add traces until the combined number of traces (i.e. T1+T2) reaches the limit of what the router should be able to handle simultaneously. With all of these combined traces ripped up (i.e. with T0−T1−T2 remaining), potential new traces (T3) are generated for the unrouted region. The actual traces ripped up are the infeasibility path traces together with those of the potential extra traces for ripup which conflict with the potential new traces (i.e., T1+T2A, where T2A is a subset of T2 containing those traces which conflict with traces from T3).

CONCLUSION

The foregoing description is presented to enable one to make and use the invention, and is provided in the context of a particular application and its requirements. It is not intended to be exhaustive or to limit the invention to the forms disclosed. Various modifications to the disclosed embodiments will be readily apparent, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein. Accordingly, many modifications and variations will be apparent. The scope of the invention is defined by the appended claims.

The data structures and code described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Note that the invention can be applied to any type of lithographic process for fabricating semiconductor chips, including processes that make use of, deep-ultraviolet (DUV) radiation, extreme ultraviolet (EUV) radiation, X-rays, and electron beams, along with suitably modified masks.

What is claimed is:

1. A method that provides feedback from a compactor to a router to facilitate layout of an integrated circuit, comprising:

receiving a routing for a cell in an integrated circuit layout at the compactor;

attempting to compact the routing; and if compaction of the routing fails,
identifying an infeasibility path in the routing,
ripping up traces routed on the infeasibility path while leaving other traces undisturbed,
adjusting parameters associated with the routing process, wherein adjusting the parameters associated with the routing process involves adjusting design rule check (DRC) correctness parameters to enforce strict DRC correctness in the y-direction and to relax DRC correctness in the x-direction, rerouting the cell in the router using the adjusted parameters, and attempting to recompact this rerouting.

2. The method of claim 1, wherein adjusting the parameters associated with the routing process involves penalizing placement of movable objects in proximity to the infeasibility path.

3. The method of claim 1, further comprising ripping up additional traces in the cell, whereby ripping up additional traces increases possibilities for rerouting the infeasibility path thereby providing more freedom for changes in the routing.

4. The method of claim 1, wherein if recompaction of the routing fails, the method further comprises repeating the steps of:

identifying the infeasibility path in the routing;

ripping up traces routed on the infeasibility path while leaving other traces undisturbed;

adjusting parameters associated with the routing process;

rerouting the cell in the router using the adjusted parameters; and attempting to recompact this rerouting.

5. A computer-readable storage medium storing instructions that when executed by a computer cause the computer to perform a method that provides feedback from a compactor to a router to facilitate layout of an integrated circuit, the method comprising:

receiving a routing for a cell in an integrated circuit layout at the compactor;

attempting to compact the routing; and if compaction of the routing fails, identifying an infeasibility path in the routing, ripping up traces routed on the infeasibility path while leaving other traces undisturbed, adjusting parameters associated with the routing process, wherein adjusting the parameters associated with the routing process involves adjusting design rule check (DRC) correctness parameters to enforce strict DRC correctness in the y-direction and to relax DRC correctness in the x-direction, rerouting the cell in the router using the adjusted parameters, and attempting to recompact this rerouting.

6. The computer-readable storage medium of claim 5, wherein adjusting the parameters associated with the routing process involves penalizing placement of movable objects in proximity to the infeasibility path.

7. The computer-readable storage medium of claim 5, the method further comprising ripping up additional traces in the cell, whereby ripping up additional traces increases possibilities for rerouting the infeasibility path thereby providing more freedom for changes in the routing.

8. The computer-readable storage medium of claim 5, wherein if recompaction of the routing fails, the method further comprises repeating the steps of:

identifying the infeasibility path in the routing;

ripping up traces routed on the infeasibility path while leaving other traces undisturbed;

adjusting parameters associated with the routing process;

rerouting the cell in the router using the adjusted parameters; and attempting to recompact this rerouting.

9. An apparatus that provides feedback from a compactor to a router to facilitate layout of an integrated circuit, comprising:

a receiving mechanism configured to receive a routing for a cell in an integrated circuit layout at the compactor;

a compacting mechanism configured to attempt to compact the routing;

an identifying mechanism configured to identify an infeasibility path in the routing if compaction of the routing fails;

a trace ripping mechanism configured to rip up traces routed on the infeasibility path while leaving other traces undisturbed;

an adjusting mechanism configured to adjust parameters associated with the routing process;

wherein the adjusting mechanism is further configured to adjust the parameters associated with the routing process by adjusting design rule check (DRC) correctness parameters to enforce strict DRC correctness in the y-direction and to relax DRC correctness in the x-direction; and a rerouting mechanism configured to reroute the cell in the router using the adjusted parameters;

wherein the compacting mechanism is further configured to attempt to recompact this rerouting.

10. The apparatus of claim 9, wherein the adjusting mechanism is further configured to adjust the parameters associated with the routing process by penalizing placement of movable objects in proximity to the infeasibility path.

11. The apparatus of claim 9, wherein the trace ripping mechanism is further configured to rip up additional traces in the cell, whereby ripping up additional traces increases possibilities for rerouting the infeasibility path thereby providing more freedom for changes in the routing.

12. The apparatus of claim 9, further comprising a repeating mechanism configured to repeat the steps of:

receiving a routing for a cell in an integrated circuit layout at the compactor;

attempting to compact the routing; and if compaction of the routing fails, identifying an infeasibility path in the routing, ripping up traces routed on the infeasibility path while leaving other traces undisturbed, adjusting parameters associated with the routing process, rerouting the cell in the router using the adjusted parameters, and attempting to recompact this rerouting.

13. A feedback means that provides feedback from a compactor to a router to facilitate layout of an integrated circuit, comprising:

a receiving means for receiving a routing for a cell in an integrated circuit layout at the compactor;

a compacting means for attempting to compact the routing;

an identifying means for identifying an infeasibility path in the routing, if compaction of the routing fails;

a ripping means for ripping up traces routed on the infeasibility path while leaving other traces undisturbed;

an adjusting means for adjusting parameters associated with the routing process, wherein adjusting the parameters associated with the routing process involves adjusting design rule check (DRC) correctness parameters to enforce strict DRC correctness in the y-direction and to relax DRC correctness in the x-direction; and a rerouting means for rerouting the cell in the router using the adjusted parameters;

wherein the compacting means is further configured to attempt to recompact this rerouting.

14. The feedback means of claim 13, wherein adjusting the parameters associated with the routing process involves penalizing placement of movable objects in proximity to the infeasibility path.

15. The feedback means of claim 13, wherein the ripping means is further configured to rip up additional traces in the cell, whereby ripping up additional traces increases possibilities for rerouting the infeasibility path thereby providing more freedom for changes in the routing.

16. The feedback means of claim 13, further comprising a repeating means for repeating the steps of:

identifying the infeasibility path in the routing;

ripping up traces routed on the infeasibility path while leaving other traces undisturbed;

adjusting parameters associated with the routing process;

rerouting the cell in the router using the adjusted parameters; and attempting to recompact this rerouting.

* * * * *